United States Patent
Rusu

(10) Patent No.: US 9,342,132 B2
(45) Date of Patent: May 17, 2016

(54) APPARATUS, METHOD, AND SYSTEM FOR ADAPTIVE COMPENSATION OF REVERSE TEMPERATURE DEPENDENCE

(75) Inventor: Stefan Rusu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 290 days.

(21) Appl. No.: 13/994,026

(22) PCT Filed: Dec. 21, 2011

(86) PCT No.: PCT/US2011/066465
§ 371 (c)(1),
(2), (4) Date: Jun. 13, 2013

(87) PCT Pub. No.: WO2013/095429
PCT Pub. Date: Jun. 27, 2013

(65) Prior Publication Data
US 2014/0201550 A1    Jul. 17, 2014

(51) Int. Cl.
*G06F 1/00*    (2006.01)
*G06F 1/32*    (2006.01)
(Continued)

(52) U.S. Cl.
CPC ............. *G06F 1/324* (2013.01); *G06F 1/206* (2013.01); *H03L 1/02* (2013.01); *G06F 1/32* (2013.01); *G06F 1/3206* (2013.01); *G06F 1/3234* (2013.01); *G06F 1/3243* (2013.01); *G06F 1/3296* (2013.01); *G06F 9/4893* (2013.01); *G06F 11/3024* (2013.01); *G06F 11/3058* (2013.01)

(58) Field of Classification Search
CPC ......... G06F 1/206; G06F 1/32; G06F 1/3206; G06F 1/3234; G06F 1/324; G06F 1/3243; G06F 1/3296; G06F 9/4893; G06F 11/3024; G06F 11/3058

USPC ................................. 713/300, 320, 322, 323
See application file for complete search history.

(56) References Cited

U.S. PATENT DOCUMENTS 5,752,011 A  *  5/1998  Thomas et al. ............... 713/501
5,798,667 A       8/1998  Herbert
(Continued)

FOREIGN PATENT DOCUMENTS

TW           201013388 A      4/2010

OTHER PUBLICATIONS

First Notification for Rectification issued for Chinese Patent Application No. 201220715868.6, mailed Feb. 10, 2014, 5 pages.
(Continued)

*Primary Examiner* — Michael J Brown
(74) *Attorney, Agent, or Firm* — Blakely, Sokoloff, Taylor & Zafman LLP

(57) ABSTRACT

Described herein are an apparatus, method, and system for adaptive compensation for reverse temperature dependence in a processor. The apparatus comprises: a first sensor to determine operating temperature of a processor; a second sensor to determine behavior of the processor; and a control unit to determine a frequency of a clock signal for the processor and a power supply level for the processor according to the determined operating temperature and behavior of the processor, wherein the control unit to increase the power supply level from an existing power supply level, and/or reduce frequency of the clock signal from an existing frequency of the clock signal when the operating temperature is in a region of reverse temperature dependence (RTD).

20 Claims, 10 Drawing Sheets

(51) Int. Cl.
*G06F 1/20* (2006.01)
*H03L 1/02* (2006.01)
*G06F 9/48* (2006.01)
*G06F 11/30* (2006.01)

(56) References Cited

U.S. PATENT DOCUMENTS

| | | | |
|---|---|---|---|
| 7,508,250 | B1 | 3/2009 | Bernstein et al. |
| 2002/0194402 | A1 | 12/2002 | Kung et al. |
| 2004/0037346 | A1 | 2/2004 | Rusu et al. |
| 2004/0207532 | A1 | 10/2004 | Smithson |
| 2006/0030274 | A1 | 2/2006 | Kappes et al. |
| 2006/0139099 | A1 | 6/2006 | Osborn |
| 2008/0162972 | A1* | 7/2008 | Liu et al. ............ 713/324 |
| 2009/0289615 | A1* | 11/2009 | Foley ............ G06F 1/3203 323/318 |
| 2010/0095260 | A1 | 4/2010 | Tetelbaum |
| 2011/0225436 | A1 | 9/2011 | Beard |

OTHER PUBLICATIONS

Notice of Allowance from foreign counterpart Taiwan Patent Application No. 101143270, mailed Jan. 19, 2015, 2 pages.

Int'l Search Report and Written Opinion mailed Sep. 5, 2012 for Int'l Application No. PCT/US2011/06465.

Han, Shu-Jen, et al., "*Reverse Temperature Dependence of Circuit Performance in High-k/Metal Gate Technology*" by Shu-Jen Han et al., Dec. 12, 2009 in IEEE Xplore, 3, vol. 30, pp. 1344-1346.

First Office Action issued for Chinese Utility Model Patent Application No. 201220715868.6, mailed on Apr. 27, 2013.

PCT/US2011/066465 Notification Concerning Transmittal of International Preliminary Report on Patentability, mailed Jul. 3, 2014, 7 pages.

Second Office Action issued for Chinese Patent Application No. 201220715868.6, mailed Aug. 7, 2013, 5 pages.

Third Office Action issued for Chinese Patent Application No. 201220715868.6, mailed Oct. 31, 2013, 5 pages.

Notice of Granting Patent Right for Utility Model from foreign counterpart China Patent Application No. 201220715868.6, mailed Apr. 18, 2014, 4 pages.

Office Action and Taiwan Search Report from foreign counterpart Taiwan Patent Application No. 101143270, mailed Oct. 7, 2014, 39 pages.

Extended European Search Report from counterpart European Patent Application No. 11877648.3, mailed Jul. 2, 2015, 10 pages.

Supplementary European Search Report from counterpart European Patent Application No. 11877648.3, mailed Jul. 21, 2015, 1 page.

Kumar, Ranjith et al., "Temperature-Adaptive Dynamic Voltage Scaling for High Temperature Energy Efficiency in Subthreshold Memory Banks," pp. 562-565, IEEE 2008, 4 pages.

Wolpert, David, "A Sensor System to Detect Positive and Negative CurrentTemperature Dependences," IEEE Transactions on Circuits and Systems . . . II: Express Briefs, vol. 58, No. 4, Apr. 2011, pp. 235-239, 5 pages.

\* cited by examiner

APPARATUS, METHOD, AND SYSTEM FOR ADAPTIVE COMPENSATION OF REVERSE TEMPERATURE DEPENDENCE

CLAIM OF PRIORITY

This application claims the benefit of priority of International Patent Application No. PCT/US2011/066465 filed Dec. 21, 2011, titled "APPARATUS, METHOD, AND SYSTEM FOR ADAPTIVE COMPENSATION OF REVERSE TEMPERATURE DEPENDENCE," which is incorporated by reference in its entirety.

FIELD OF THE INVENTION

Embodiments of the invention relate generally to the field of processors. More particularly, embodiments of the invention relate to an apparatus, method, and system for adaptive compensation of reverse temperature dependence (RTD) in a processor.

BACKGROUND

CMOS circuits exhibit two temperature dependence regions as a function of the operating voltage. These two temperature dependence regions are Normal Temperature Dependence (NTD) region and Reverse Temperature Dependence (RTD) region. In the NTD region, transistor drive current decreases with increasing temperature. In the RTD region, transistor drive current increases with higher temperatures.

Generally, NTD effects are observed at high operating voltages and RTD effects are observed at low operating voltages, with a temperature insensitive supply voltage (Vins) separating these two regions. FIG. 1 is a plot 100 showing NTD 102 and RTD 103 regions for a processor with Vins 101 separating the two regions. The x-axis of the plot 100 is processor frequency while the y-axis of the plot 100 is supply voltage to the processor. When the processor operates at Vins 101, the transistor drive current in the processor is insensitive to temperature changes.

Effects of RTD are becoming more pronounced with transistor scaling to smaller geometries. For example, High-K/Metal Gate (HK/MG) transistor devices exhibit a higher Vins (and therefore a more pronounced RTD effect) due to stronger threshold voltage temperature dependence, compared to transistor devices using the poly-silicon gate and silicon oxide technology. In addition, since most processors operate at lower voltages (close to VCCmin, which is the lowest operating voltage level) to save power, the processors will operate most of the time in the RTD region. Since speed of transistors in a processor gets slower at lower temperatures in the RTD region, data paths in the processor may violate timing specifications causing the processor operations to become unreliable.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
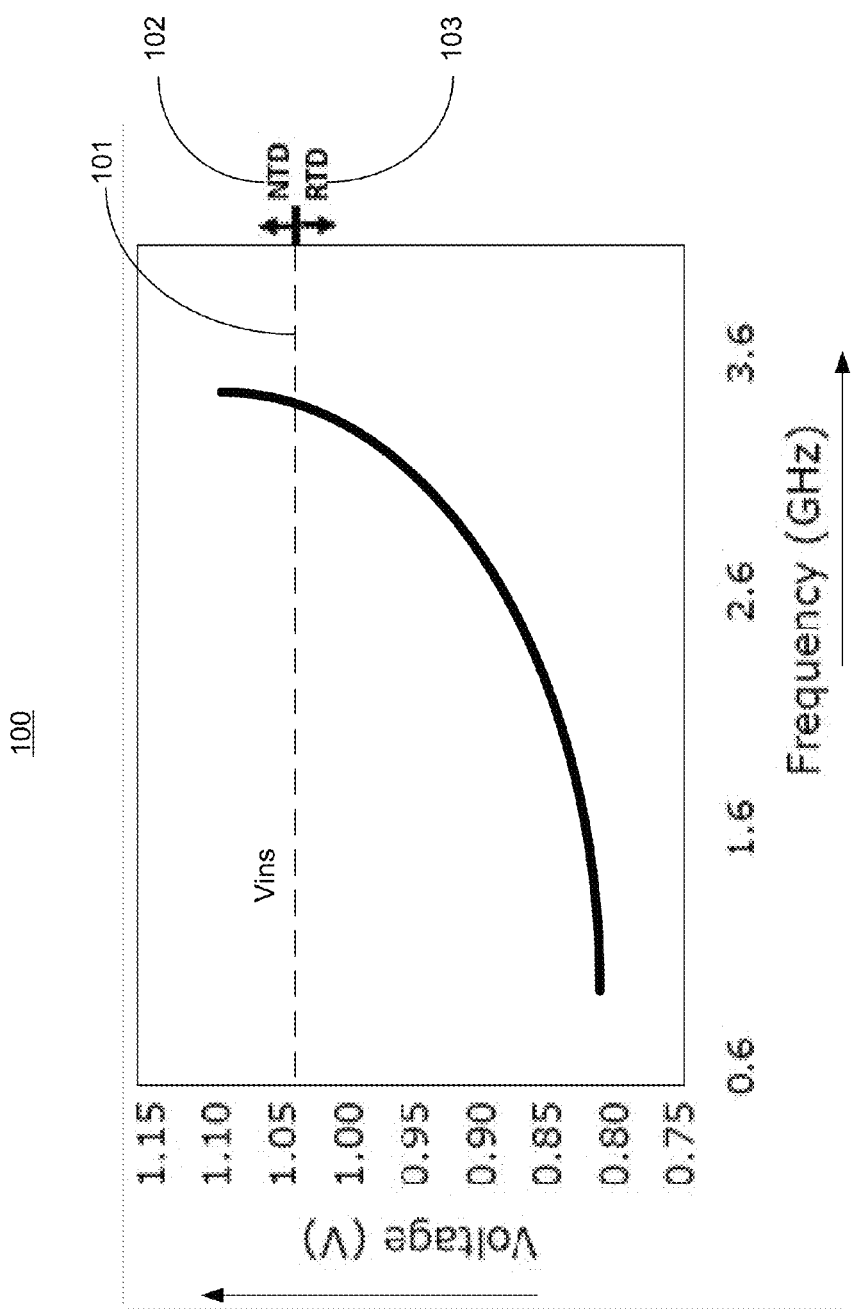
FIG. 1 is a plot showing normal temperature dependence (NTD) and reverse temperature dependence (RTD) regions for a processor.

Embodiments of the invention relate to an apparatus, method, and system for adaptive compensation of reverse temperature dependence (RTD) effects in a processor. Since transistors are getting slower at lower temperatures in the RTD region, to operate the processor reliably either the frequency (at the same power supply voltage) can be lowered or the supply voltage (at the same frequency) can be raised, according to one embodiment of the invention. In one embodiment, processor supply voltage is raised, when the processor operates at lower temperatures, by a Power Control Unit (PCU)—an on-die micro-controller that monitors operating temperature and determines the operating voltage and frequency for the entire chip.

The voltage correction coefficient may be the same for all parts (also called processor dies) and does not take into account the part-to-part variability (each part has a different temperature and voltage behavior due to voltage threshold Vt variations). The higher operating supply voltage causes increased active and leakage power when the processor is in a low activity condition. In one embodiment, the processor comprises a first sensor to determine operating temperature of a processor. For example, the first sensor is a temperature sensor. In one embodiment, the processor further comprises a second sensor (e.g., replica oscillator, and/or in-situ warning sensor) to determine behavior of the processor; and a control unit to determine a frequency of a clock signal for the processor and a power supply level for the processor according to the determined operating temperature and behavior of the processor. In such an embodiment, the control unit is operable to: increase the power supply level from an existing power supply level; and reduce frequency of the clock signal from an existing frequency of the clock signal when the operating temperature of the processor is determined to be in a region of RTD.

The technical effects of the embodiments herein are many, and include adaptively compensating for RTD effects in the processor. For example, the processor can now operate at VccMin (lowest operating supply voltage level) without degrading performance caused by RTD. By using behavior sensors in the processor, the processor can adaptively predict whether the RTD effects are adverse enough to require compensation without causing the processor to become operationally unreliable. The above mentioned technical effects are not limiting. Other technical effects are contemplated by the embodiments discussed herein.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of this application, the transistors described in this application are metal oxide semiconductor (MOS) transistors, which include drain, source, and gate terminals. However, those skilled in the art will appreciate that other transistors may be used without departing from the scope of the invention.

The term "adaptively" herein generally refers to continuous and regular compensation of RTD effects by logic and circuits discussed herein when a circuit, for example a processor, enters the RTD region.

Figure 2:
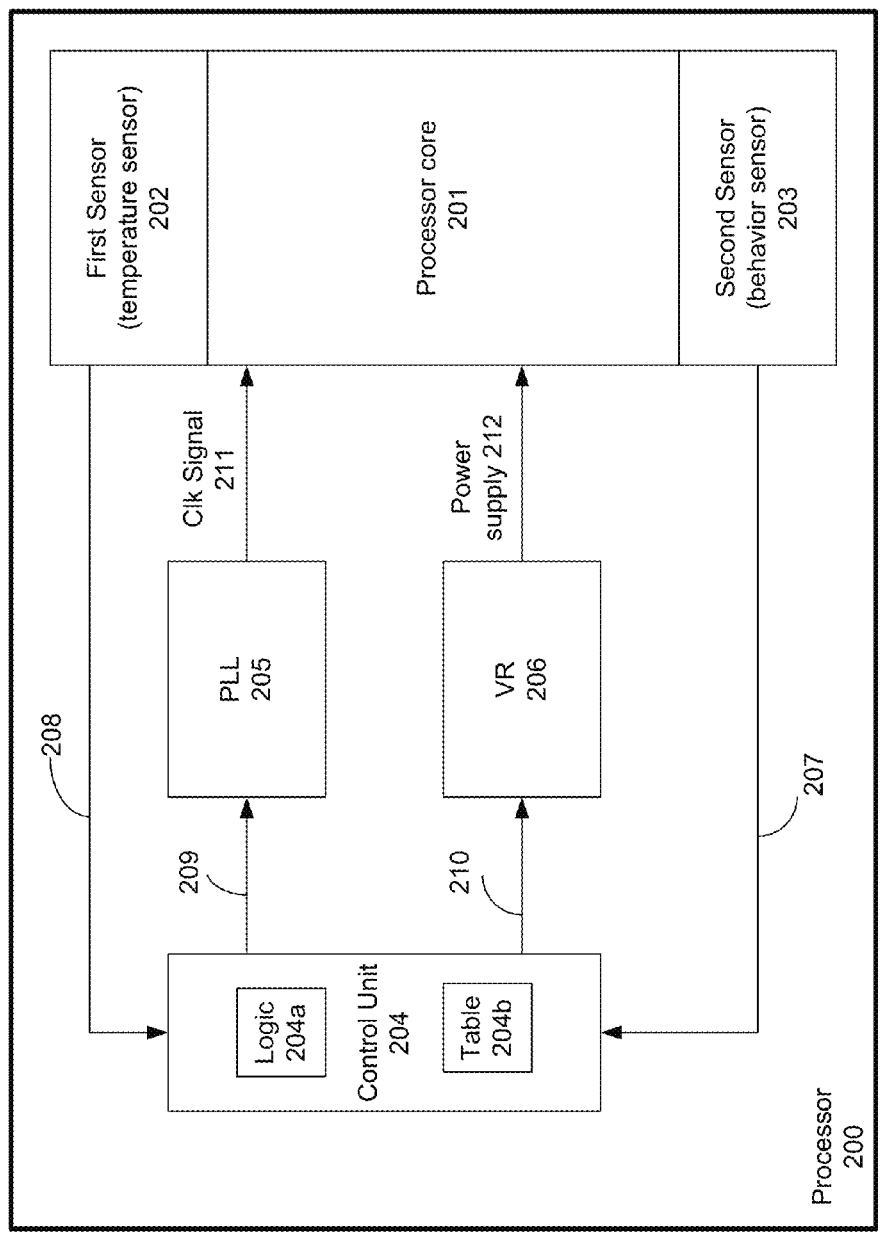
FIG. 2 is a processor with logic units for adaptively compensating RTD effects, according to one embodiment of the invention.

FIG. 2 is a processor 200 with logic units for adaptively compensating RTD effects in the processor 200, according to one embodiment of the invention. In one embodiment, the processor 200 comprises a first sensor 202 and a second sensor 203 coupled to a processing core 201. The processing core 201 includes logic units such as, floating point unit, integer unit, register file, etc., and any other logic unit to process computer executable instructions.

In one embodiment, the first sensor 202 is a temperature sensor and the second sensor 203 is a behavior sensor. In one embodiment, the first sensor 202 comprises local and/or remote temperature sensors scattered at various locations in the processor core 201 to sense temperature of the processor core 201. In one embodiment, the first sensor 202 includes logic to convert the sensed temperatures into digital representative values.

In one embodiment, the second sensor 203 comprises a replica core behavior sensor and/or an in-situ timing warning sensor to determine and/or predict the behavior of the processor core 201. In one embodiment, the behavior of the processor core 201 comprises at least one of work load of the processor core 201 and timing margin for a critical data path in the processor 201. The replica core behavior sensor is discussed herein with reference to FIGS. 6-7. The in-situ timing warning sensor is discussed herein with reference to FIGS. 8-9.

Referring back to FIG. 2, the second sensor 203 collects information indicating the current behavior and possible future behavior of the processor core 201 under the current power supply and temperature conditions. For example, the second sensor 203 may indicate via a frequency of a ring oscillator compared to a phase and frequency locked processor clock signal whether the processor core 201 is slowing down with decreasing temperature. Such sensing may indicate that the processor is entering the RTD region. The second sensor 203 may also predict timing failures by monitoring critical timing paths in the processor core 201. If the timing failures are predicted to occur as temperature level drops, then such sensing by the second sensor 203 may indicate that the processor core 201 is entering the RTD region. Once the processor enters the RTD region, a control unit 204 uses the data from the sensor 203 to determine how much adjustment in voltage and/or frequency need to be made for the processor core 201 so that that processor core 201 operates reliably in the RTD region.

In one embodiment, the processor 200 comprises the control unit 204 which determines control signals 209 and 210 for adjusting clock signal frequency 211 and the operating power supply 212 for the processor core 200. The control unit 204 is also referred herein as the power control unit (PCU). In this embodiment, the control unit 204 is operable to receive temperature and behavior information of the processor core 201 via signals 208 and 207 from the first 202 and second 203 sensors respectively.

In one embodiment, the control unit 204 includes a storage medium having instructions stored thereon to operate the control unit 204, and wherein the instructions are invisible to an operating system. In such an embodiment, the processor 200 is secured from malicious attempts to modify the criteria for compensating RTD effects.

In one embodiment, the control unit 204 comprises a logic unit 204a which is operable to analyze the information from signals 208 and 207 and compare them with information stored on a table 204b of the control unit 204. In such an embodiment, the logic unit 204a determines what clock signal frequency and/or power supply voltage level for the processor core 201 should be selected in view of the information from the signals 208 and 207. For example, the logic unit 204a calculates an equation to compensate for slowdown of the transistors in the processor core 201.

In one embodiment, the contents of the table 204b include voltage identification (VID) settings corresponding to various temperature values and various phase locked loop (PLL) clock frequency output settings. The logic unit 204a may determine what VID and clock frequency setting to choose based on the information from the signals 208 and 207. For example, the logic unit 204a may select a frequency divider ratio setting that determines the clock signal 211 frequency without having to relock the PLL 205. The logic unit 204 may also provide new VID settings via signal 210 to a voltage regulator (VR) 206 so that the VR may ramp up or down the power supply level 212 for the processor core 201.

In one embodiment, the adjustment to the frequency of the clock signal 211 and the level of the power supply voltage 212 is performed slowly enough for the processor core 201 to continue with its execution uninterrupted, i.e. the PLL 205 is not re-locked and/or the VR 206 is not re-started from a discharged power supply level.

In one embodiment, the PLL 205 is an analog PLL. For example, the PLL 205 is a self-biased PLL (SBPLL) which is operable to adjust the frequency of the clock signal 211 by frequency steps, for example 100 MHz steps. In such an embodiment, the signal 209 is used to select signal to select a multiplier ratio of a divider circuit (not shown) of the SBPLL so that its output frequency is adjusted by a step size (e.g., 100 MHz). In one embodiment, the PLL 205 is an all digital PLL (ADPLL). For example, the PLL 205 is operable to tune the frequency of the clock signal 211 by a fine granularity, i.e. much finer than 100 MHz steps. The embodiments herein are not limited to the SBPLL and the ADPLL, any other PLL, for example LCPLL, may be substituted for the PLL 205 without changing the essence of the embodiments of the invention.

In one embodiment, the VR 206 is an on-die VR which is operable to regulate power supply 212 in response to the signal 210. In one embodiment, the signal 210 from the control unit 204 is a VID signal which indicates a level of power supply 212 to be supplied to the processor core 201. In one embodiment, the VR 206 provides multiple power supplies to the processor core 201 and the control unit 204 is operable to determine power supply levels for each power supply for the processor core 201 to compensate for RTD effects.

In one embodiment, the control unit 204 uses data stored in on-die fuses (not shown) to determine the initial frequency for the clock signal 211 and the power supply 212. In such an embodiment, as the processor core 201 operates, the control unit 204 monitors the second sensor 203 and learns the operating frequency limit at different voltage and temperature points for the processor 201. In one embodiment, this learnt data is stored by the control unit 204 in an on-die register file array (not shown) and enables the adaptive compensation for the processor core 201. In this embodiment, the register file array is operated on a power supply which is the same power supply used by the first sensor 202. This allows the register file array to save the learnt data as long as the first sensor 202 is capable of sensing temperature of the processor core 201.

In one embodiment, after the learning cycle is complete, the control unit 204 begins to operate in the fully-adaptive mode. For example, if the temperature of the processor core 201 is dropping and the control unit 204 determines that the processor core 201 is in the RTD region of operation, the second sensor 203 will signal the control unit 204 that the processor core 201 should be compensated for RTD effects. In one embodiment, the control unit 204 performs RTD compensation by reducing frequency (through the PLL 205) of the clock signal 211 or by raising voltage (through the VR 206) of the power supply 212 until the second sensor 203 signals a stable operation. In one embodiment, a combination of partial voltage and partial frequency adjustment is implemented by the control unit 204 to compensate for RTD effects. In one embodiment, the control unit 204 maintains power supply voltage 212 and clock frequency 211 conditions above the timing failure point, i.e. the processor core 201 is operated at slightly higher voltage and/or lower clock frequency to prevent any timing critical paths from failing.

Figure 3:
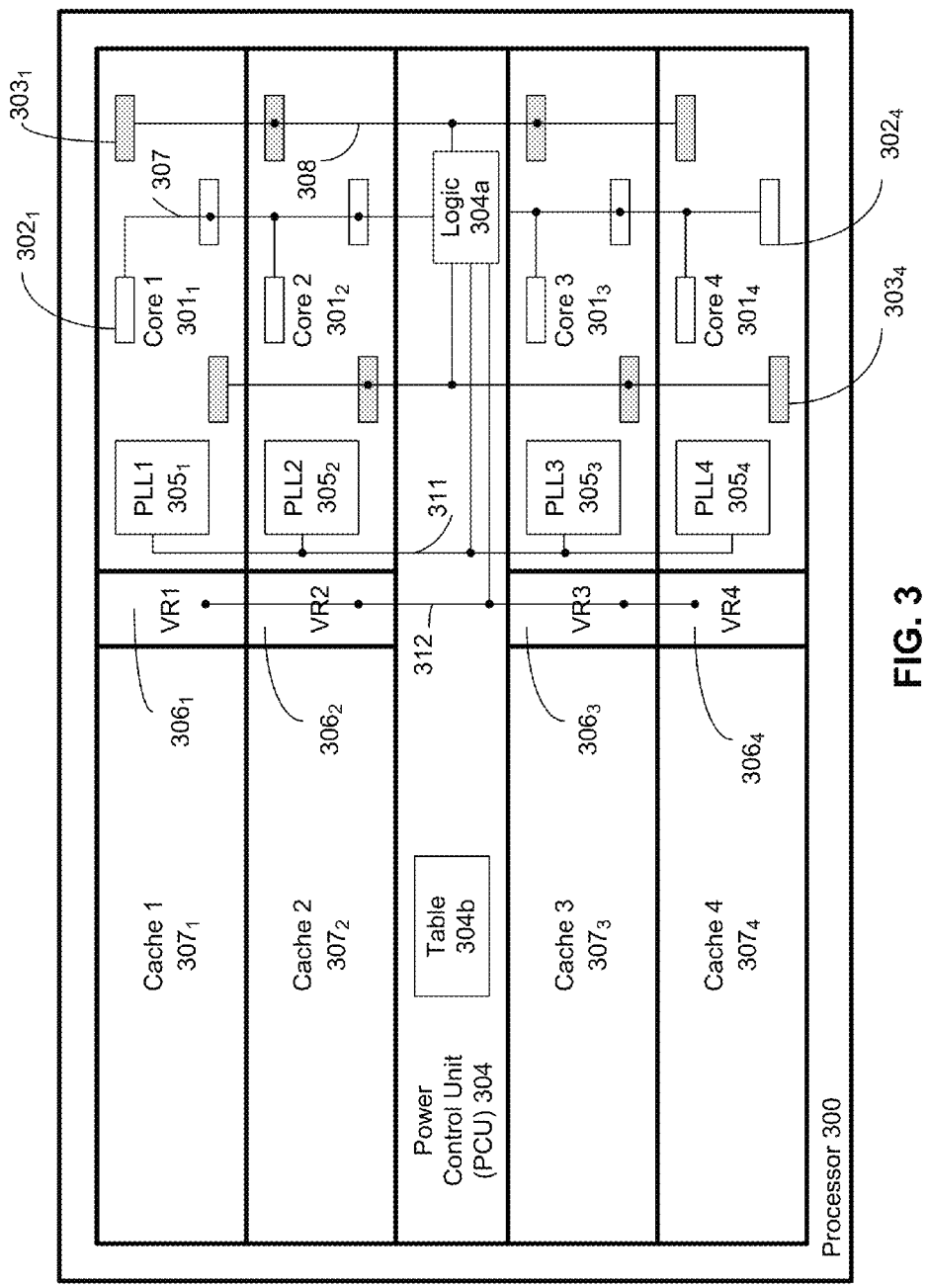
FIG. 3 is a processor with multiple hardware processing cores and with logic units for adaptively compensating RTD effects, according to one embodiment of the invention.

FIG. 3 is a processor 300 with multiple hardware processing cores $301_{1-4}$ and with logic units for adaptively compensating RTD effects, according to one embodiment of the invention. The embodiment of FIG. 3 is similar to the embodiment of FIG. 2 except that the processor 300 includes multiple hardware processing cores $301_{1-4}$ and that the PCU 304 is operable compensate for RTD effects in each hardware processing core independently or collectively.

So as not to obscure the embodiments of FIG. 3, only additional features (additional to those discussed with reference to FIG. 2) will be discussed herein. While the embodiment of FIG. 3 shows four hardware processing cores $301_{1-4}$, the embodiments of the invention are applicable to any number of hardware processing cores $301_{1-4}$ without changing the scope of the embodiments of the invention.

In one embodiment, the processor 300 comprises cache memories $307_{1-4}$ coupled to individual hardware processing cores $301_{1-4}$. In one embodiment, the processor 300 comprises multiple on-die VRs $306_{1-4}$ to provide regulated power supply (one or more) to the corresponding hardware processing cores $301_{1-4}$. In one embodiment, the processor 300 comprises multiple first $302_{1-4}$ and second $303_{1-4}$ sensors distributed at various locations in the hardware processing cores $301_{1-4}$. The shaded sensors ($302_{1-4}$) represent the temperature sensors while the un-shaded sensors ($303_{1-4}$) represent the behavior sensors. In one embodiment, each of the hardware processing cores $301_{1-4}$ includes its corresponding PLL $305_{1-4}$.

While the embodiments herein illustrate one PLL per hardware processing core, each hardware processing core can have multiple PLLs for generating clock signals for different logic units (e.g., for input-output transceivers, for general core operation, etc). In such an embodiment, the PCU 304 is operable to adjust the clock frequency of each PLL in the hardware processing core to compensate for RTD effects.

In one embodiment, the PCU 304 includes a table 304b that stores VID settings corresponding to various temperature values and various PLL clock frequency output settings for each of the hardware processing cores $301_{1-4}$. In one embodiment, the PCU 304 includes a logic unit 304a (similar to logic unit 204a of FIG. 2) which is operable to receive sensor data from the first $302_{1-4}$ and second $303_{1-4}$ sensors via signal buses 308 and 307 respectively. In one embodiment, the PCU 304 analyzes (as discussed with reference to FIG. 2) the sensor data from signal buses 308 and 307 and generates VID settings 312 for voltage regulators $306_{1-4}$ and PLL clock frequency settings 311 for PLLs $305_{1-4}$.

In one embodiment, at power-up, the PCU 304 uses data stored in on-die fuses (not shown) to determine the initial frequencies for the clock signals 311 to be generated by each PLL from among the PLLs $305_{1-4}$, and the power supply levels 312 to be supplied by each of the VRs $306_{1-4}$. In such an embodiment, as each processor core from among the processing cores $301_{1-4}$ operates, the PCU 304 monitors the second sensors $302_{1-4}$ for each processor core and learns the operating frequency limit at different voltage and temperature points for the each processor core.

In one embodiment, this learnt data is stored by the PCU 304 in a non-volatile memory (not shown) and enables the adaptive compensation for each processor core from among the processor cores $301_{1-4}$. In one embodiment, the non-volatile memory is part of the processor 300. In another embodiment, the non-volatile memory is communicatively coupled to the processor 300. In one embodiment, the learnt data is stored by the PCU 304 in a register file array (not shown) in each of the processor cores $301_{1-4}$. In this embodiment, the register file array is operated on a power supply which is the same power supply used by the first sensors $302_{1-4}$.

In one embodiment, when the entire processor 300 is powered down or goes through a full reset cycle, this data in the register file arrays of each processor core is lost and may need to be re-learned at the next power-on event. In one embodiment, when entire processor 300 is powered down or goes through a full reset cycle, the learnt data is not lost because it is stored in a non-volatile memory. In such an embodiment, upon a next power-on event, the learnt data is available to the PCU 304.

In one embodiment, when the one of the processor cores $301_{1-4}$ is shut off to save leakage power dissipation (or for any other reason), the voltage and temperature coefficients are maintained either in the register file array of that processor or in the non-volatile memory (of the processor 300 or communicatively coupled to the processor 300). After the learning cycle is complete, the PCU 304 will start operating in the fully-adaptive mode. For example, if any of the processor cores' temperature is dropping and the PCU 304, via the second sensors $303_{1-4}$, determines that one of the processor cores $301_{1-4}$ is operating in the RTD region, the PCU 304 will implement the compensation for RTD effects by reducing frequency of the clock signal 311 (through the PLL) or by raising voltage (through the VR) until the second sensor signals stable operation. The term "stable" herein refers to correct operation by the processor, i.e. the critical paths in the processor are properly functioning. In one embodiment, a combination of partial voltage and partial frequency adjustment is performed. In one embodiment, the PCU 304 always maintains power supply voltage and clock frequency conditions above the timing failure point, i.e. the processing cores are operating at slightly higher power supply voltage and/or lower clock frequency to prevent any timing critical paths from failing.

Figure 4:
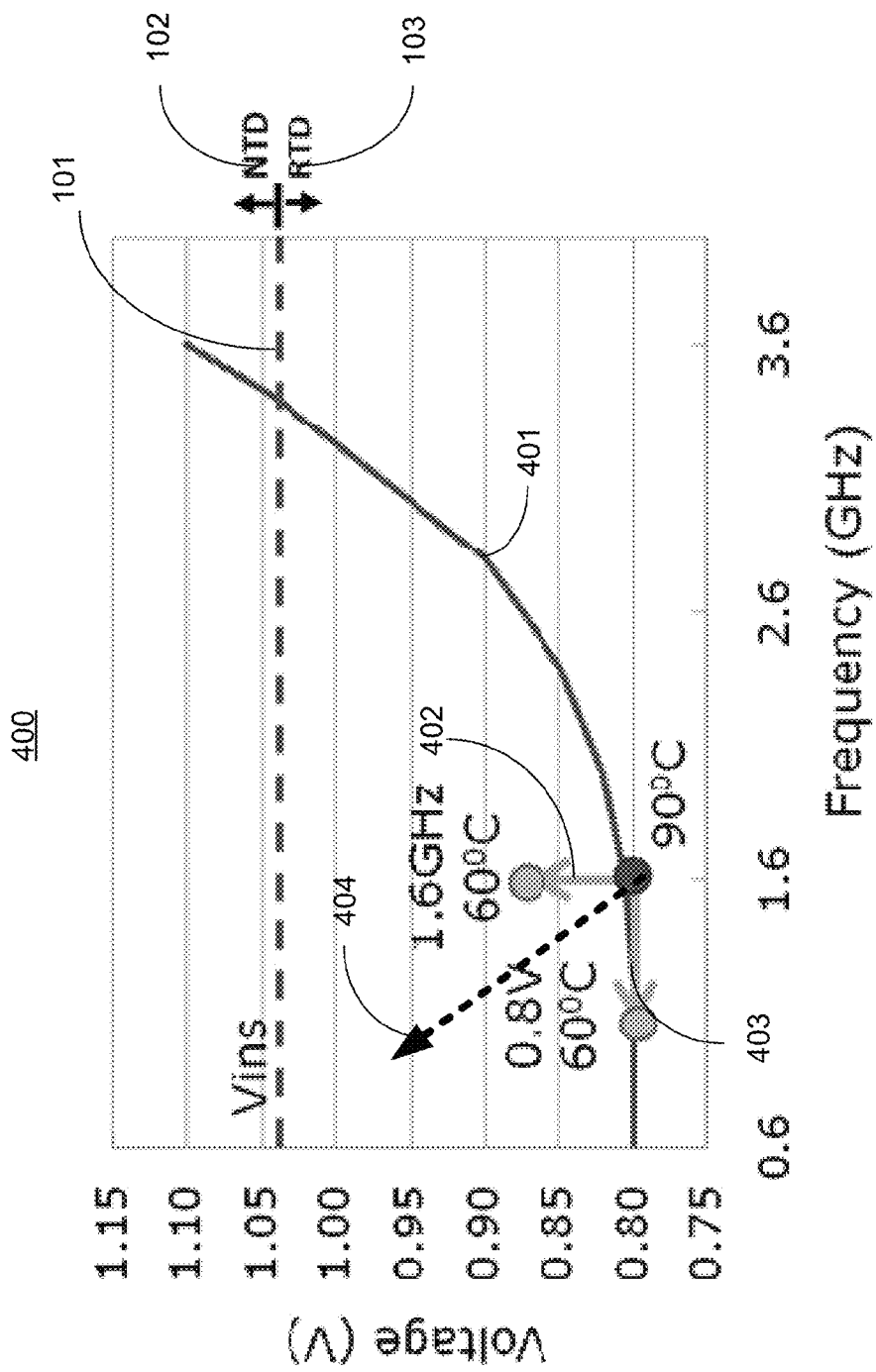
FIG. 4 is a plot showing NTD and RTD regions with options for adaptively compensating RTD effects, according to one embodiment of the invention.

FIG. 4 is a plot 400 showing NTD 102 and RTD 103 regions with options for adaptively compensating RTD effects, according to one embodiment of the invention. FIG. 4 is described with reference to FIGS. 1-3. The plot 400 shows the graphical representation of the processor operation 401 and actions performed by the PCU 204/304. The x-axis of the plot 100 is processor frequency while the y-axis of the plot 100 is supply voltage to the processor. When the processor operates at Vins 101 (i.e., when 401 intersects 101) the transistor drive current in the processor is insensitive to temperature changes.

In one embodiment, when the PCU 204/304 determines that the processor or any processor core of the processor is operating in RTD region, the PCU 204/304 has at least three options to compensate for RTD effects. These three options are indicated by reference signs 402, 403, and 404.

In option 402, the PCU 204/304 instructs the VR(s) $306_{1-4}/206$ to increase its power supply level supplied to the processor core 201 to compensate for RTD effects. For example, for the same clock signal frequency of 1.6 GHz, the power supply voltage is increased from 0.8V to 0.88V.

In option 403, the PCU 204/304 instructs the PLL(s) $205/305_{1-4}$ to reduce their clock signal frequency which is being used by the processor core 201. For example, for the same power supply voltage level from the VR $206/306_{1-4}$, the frequency of the clock signal to the processor core(s) is reduced from 1.6 GHz to 1 GHz. In option 404, the PCU 204/304 instructs both the PLL(s) $205/305_{1-4}$ and the VR(s) $206/306_{1-4}$ to reduce clock signal frequency and raise the power supply level, respectively, to compensate for RTD effects.

Figure 5:
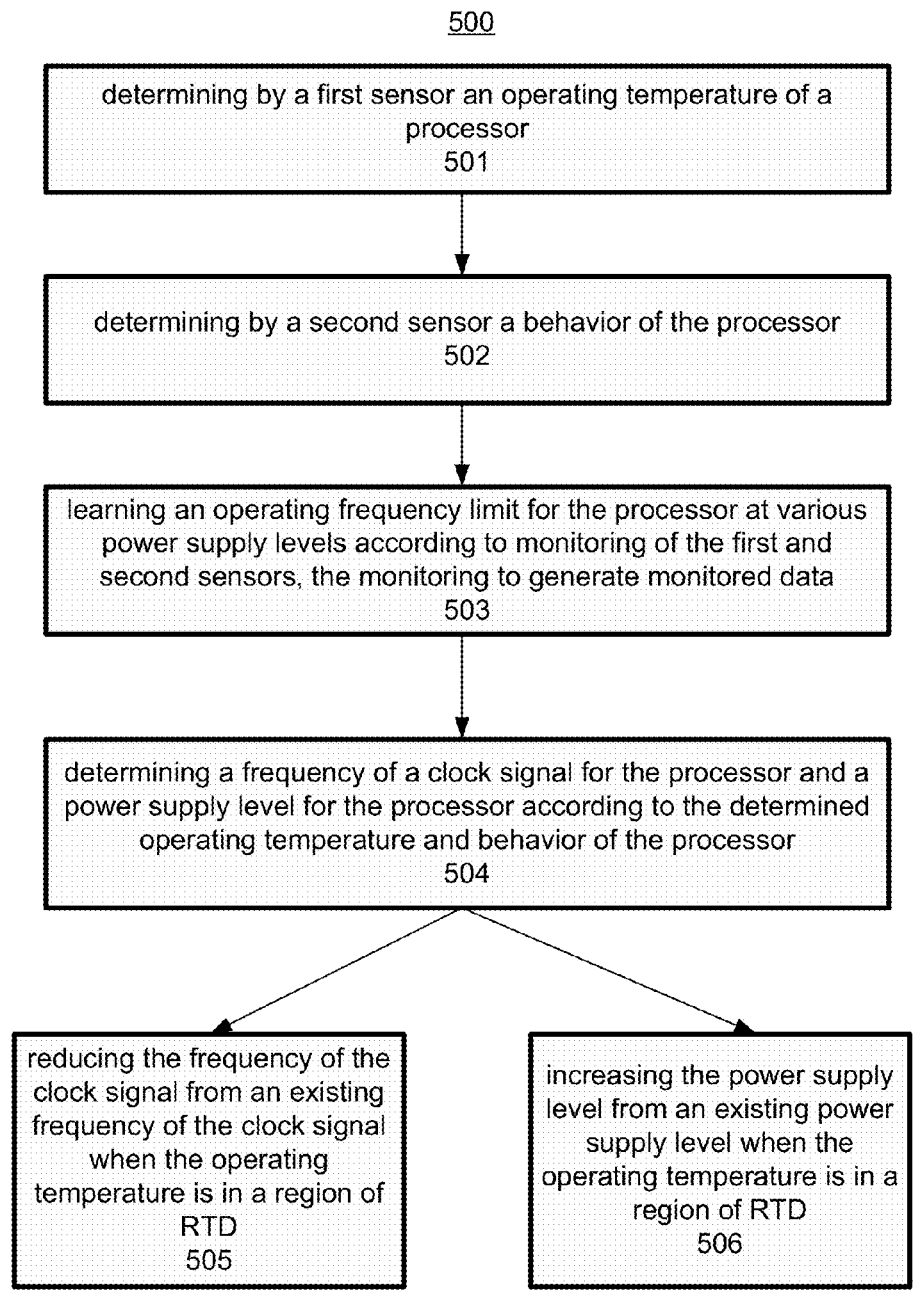
FIG. 5 is a method flowchart for adaptively compensating RTD effects, according to one embodiment of the invention.

FIG. 5 is a method flowchart 500 for adaptively compensating RTD effects, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments of adaptively compensating RTD effects. The flowchart of FIG. 5 is illustrated with reference to the embodiments of FIGS. 2-4.

At block 501, the first sensor(s) $202/302_{1-4}$ determines an operating temperature of a processor core(s) $201/301_{1-4}$. As discussed herein, the first sensor is a temperature sensor including local and remote sensors distributed at various locations in the processor core. In one embodiment, the first sensor 202 includes logic to convert the sensed temperatures into digital representative values.

At block 502, the second sensor(s) $203/303_{1-4}$ determines a behavior for the processor core(s) $201/301_{1-4}$. As discussed herein, in one embodiment, the second sensor 203 comprises a replica core behavior sensor and/or an in-situ timing warning sensor to determine and/or predict the behavior of the processor core 201. In one embodiment, the behavior of the processor core 201 comprises at least one of work load of the processor core(s) $201/301_{1-4}$, and timing margin for a critical data path in the processor core(s) $201/301_{1-4}$. The replica core behavior sensor is discussed herein with reference to FIGS. 6-7. The in-situ timing warning sensor is discussed herein with reference to FIGS. 8-9.

In one embodiment, the PCU 204/304 monitors the temperature and behavior data from the respective first $202/302_{1-4}$ and second $203/303_{1-4}$ sensors and over time generates a collection of monitored data. In one embodiment, the PCU 204/304 is stored in a non-volatile memory of the processor core $201/301_{1-4}$ or communicatively coupled to the processor core(s) $201/301_{1-4}$.

Referring back to FIG. 5, at block 503 the PCU 204/304 receives the temperature and behavior information from respective first $202/302_{1-4}$ and second $203/303_{1-4}$ sensors and learns an operating frequency limit for the processor core(s) $201/301_{1-4}$ at various power supply levels. At block 504, the PCU 204/304 determines an operating clock signal frequency of the processor core(s) $201/301_{1-4}$ and the supplies power to the processor core(s) $201/301_{1-4}$ according to the received temperature and behavior information from respective first $202/302_{1-4}$ and second $203/303_{1-4}$ sensors.

As discussed with reference to FIG. 4, the PCU 204/304 has at least three options (402, 403, and 404) for compensating for RTD effects. At block 505, the PCU 204/304 signals the PLL(s) $205/305_{1-4}$ to reduce its output clock frequency when the processor core(s) $201/301_{1-4}$ is operating in the RTD region. At block 506, the PCU 204/304 signals the VR(s) $206/306_{1-4}$ to raise its power supply voltage level when the processor core(s) $201/301_{1-4}$ is operating in the RTD region.

Figure 6:
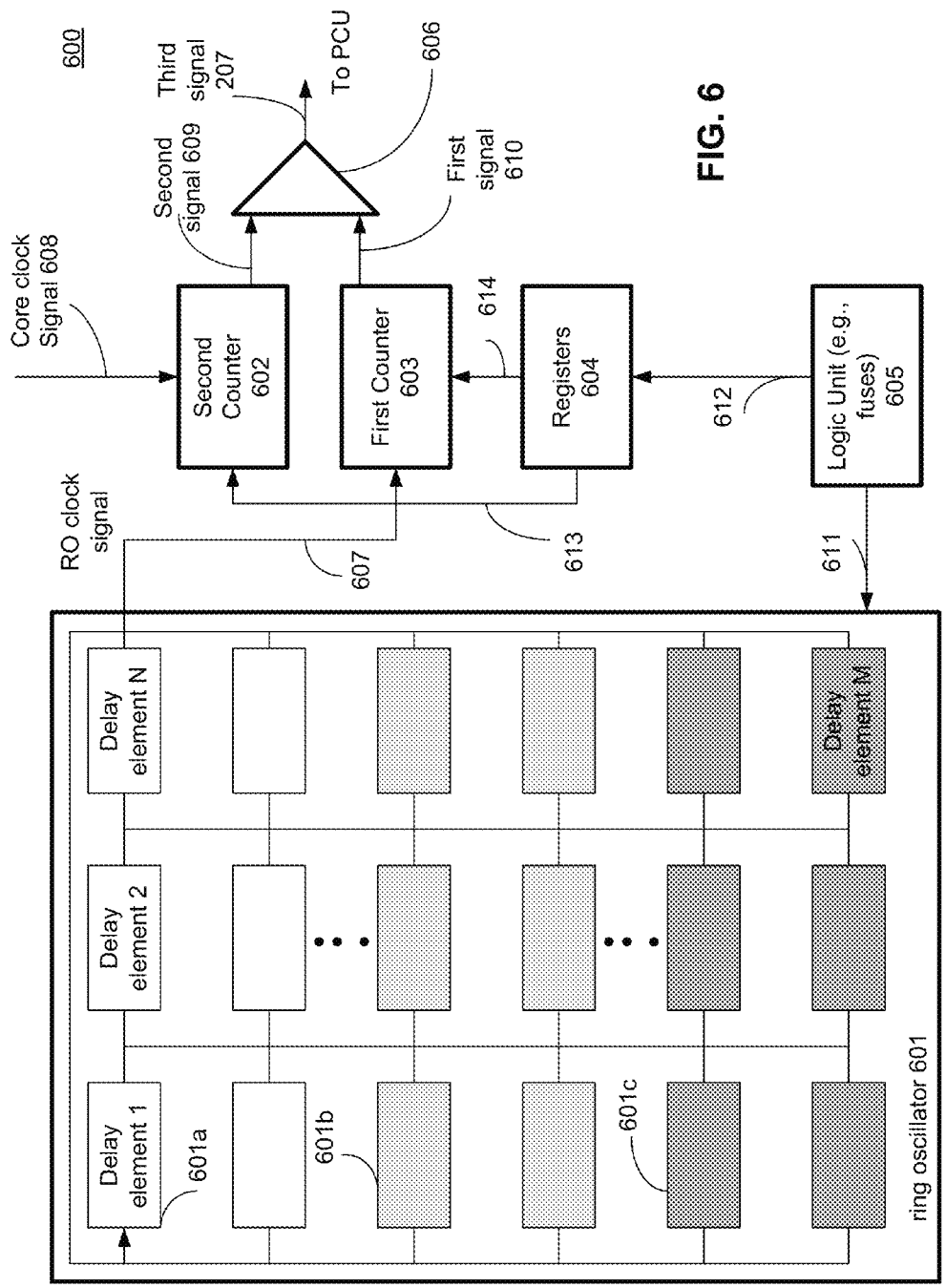
FIG. 6 is a replica ring oscillator for sensing the behavior of the processor for adaptively compensating RTD effects, according to one embodiment of the invention.

FIG. 6 is a replica ring oscillator circuit 600 for sensing the behavior of the processor core(s) $201/301_{1-4}$ for adaptively compensating RTD effects, according to one embodiment of the invention. As discussed herein, the replica ring oscillator circuit 600 is one of the second sensor(s) $203/303_{1-4}$. FIG. 6 is described with reference to FIGS. 1-5.

In one embodiment, the replica ring oscillator circuit 600 comprises a ring oscillator 601 to generate a first signal 607 (also called the ring oscillator clock signal) having a first frequency. In one embodiment, the ring oscillator 601 is operable to mimic actual temperature dependence of a processor core 201. In the embodiment of FIG. 3, where the processor 300 comprises multiple hardware processing cores $301_{1-4}$, each processing core includes a corresponding replica ring oscillator circuit 600.

Referring back to FIG. 6, in one embodiment the ring oscillator 601 has an overall delay which is a programmable delay. In one embodiment, the ring oscillator 601 is operable to include or exclude delay elements as part of the ring oscillator 601. For example, any of the delay elements shown in the ring oscillator 601 can be included or excluded from the ring forming the oscillator, wherein the ring oscillator 601 is operable to include or exclude delay elements to mimic the actual temperature dependence of the processor core 201 of the processor 200.

So as not to obscure the embodiments of the invention, the description herein discusses the use of the replica ring oscillator 600 for the processor core 201. For multi-core processors, as shown in FIG. 3, each processor core from the processor cores $301_{1-4}$ includes its own replica ring oscillator (second sensors $303_{1-4}$) to mimic the actual temperature dependence of that processor core, according to one embodiment. In such an embodiment, the PCU 304 is operable to receive the outputs from each replica ring oscillator and determine the behavior of each processor core and the overall processor 300. In one embodiment, the PCU 304 increases the power supply to the processor core that is indicating RTD effects.

In one embodiment, the delay elements (Delay elements 1-M) of the ring oscillator 601 comprise transistors of different voltage thresholds. The ring oscillator 601 indicates three shades—white 601a, light gray 601b, and dark gray 601c—indicating the different threshold voltages for different delay cells. In one embodiment, the delay elements 601a have transistors with a first voltage threshold while the delay elements 601b have transistors with a second voltage threshold, wherein the second voltage threshold is higher than the first voltage threshold. In one embodiment, the delay elements 601c have transistors of a third voltage threshold, wherein the third voltage threshold is higher than the second voltage threshold. The embodiments herein describe transistors with first, second, and third thresholds. However, the delay elements may have N and P transistors and so the embodiments contemplate different thresholds for N and P transistors such that the N and P transistor thresholds of delay elements 601a are different from the N and P transistor thresholds of the delay elements 601b and 601c.

In one embodiment, the delay elements (or cells) comprise inverters having n-type transistors of different thresholds voltages and p-type transistors of different thresholds. The higher the transistor Vt (voltage threshold) the stronger the reverse temperature behavior at low power supply voltage is observed. In one embodiment, the ring oscillator 601 uses a combination of inverters (delay elements) with different voltage thresholds to mimic the reverse temperature behavior of any circuit with a Vt composition in between.

Another factor that can be used in addition or instead of the Vt dependence is transistor stacking, for example AND vs. OR stack, 2-deep or 3-deep stacked transistors. Since the reverse temperature dependence is different for each of these circuits, the composite behavior of the processor core(s) is mimicked by adjusting the composition of each circuit type. In one embodiment, the delay elements (or cells) comprise one or more of: two input NAND gates, three input NAND gates, two input NOR gates, or three input NOR gates, wherein the NAND and NOR gates may have N and P transistors of different thresholds and same thresholds. One reason for having multiple input logic gates is to incorporate the effects of stacked N and P transistors. In one embodiment, the ring oscillator 601 operates on a power supply which is the same as the power supply of a core of the processor.

In one embodiment, the replica ring oscillator circuit 600 further comprises: a first counter 603 to generate a first count 610 corresponding to the first frequency of the first signal 607. In one embodiment, the replica ring oscillator circuit 600 further comprises a second counter 602 to generate a second count 609 corresponding to a frequency of a clock signal of the processor core 201. The first 603 and second 602 counters may be implemented by any known logical implementations for counters without changing the scope of the embodiments of the invention.

In one embodiment, the ring oscillator 601 further comprises a comparator 606, coupled to the first 603 and second 602 counters, to compare the first 610 and second 609 counts and to generate an output signal 606 indicating a behavior of the processor core 201. The comparator may be implemented with any known comparator architectures without changing the scope of the embodiments of the invention.

In one embodiment, a programmable or programmed logic unit (e.g., fuses) 605 selects, from among the various types of delay elements, a configuration of the ring oscillator 601 via select signal 611 that would best mimic the behavior of the processor. For example, if the processor 200 is formed from a wafer die which happens to have higher transistor voltage thresholds than other processors in the same wafer die then the logic unit 605 selects delay elements 601b and/or 601c which have transistors with higher threshold voltages when configuring the ring oscillator 601. In one embodiment, registers 604 store the ring oscillator configuration settings via signal 612. The registers 604 can be used for setting a length of the counters 603 and 602 via signals 614 and 613 respectively.

In one embodiment, the replica ring oscillator circuit 600 is calibrated to match the processor core 201 operating voltage, frequency, and temperature behavior. In one embodiment, the ring oscillator 600 includes multiple sub-rings connected in parallel, each sub-ring using circuits with a different temperature dependency. In one embodiment, a set of on-die fuses (e.g., logic 605) selects via signal 611 which sub-rings are enabled such that all combined sub-rings mimic the processor core 201 operating voltage, frequency, and temperature dependence.

In one embodiment, the ring oscillator output 207 is compared to the operating frequency of the processor core 201 and the result is send to the PCU 204. In one embodiment, the output signal 207 is a single bit that indicates the need to correct for RTD effects. In one embodiment, the output signal 207 is a set of bits that indicate the magnitude of the required correction to enable faster correction by using larger steps to catch up.

In one embodiment, after the ring oscillator 601 is configured by the logic unit 605 to mimic the behavior of the processor core 201, the frequency of the ring oscillator 601 represented by first count signal 610 is compared with the frequency of the processor core PLL clock signal frequency 608 which is represented by second count signal 609. If the first count signal 610 is lower than the second count signal 609 then the output 207 of the comparator 606 indicates that processor core 201 is operating in the RTD region and so the PLLs may need to be adjusted to reduce the frequency of the clock signal 608 (same as 211 of FIG. 2).

In one embodiment, the PCU 204 receives the output signal 207 which indicates a difference between the frequencies of the ring oscillator signal 607 and the core clock signal 608, and compares the difference in frequencies with the difference of frequencies in the lookup table 204b. In one embodiment, the lookup table 204b indicates what the power supply level and/or the processor core clock signal frequency should be set for a particular difference in ring oscillator signal 607 and the core clock signal 608. In one embodiment, the content of the lookup table 204b is programmable. In one embodiment, the content of the lookup table 204b is not visible to the operating system.

Figure 7:
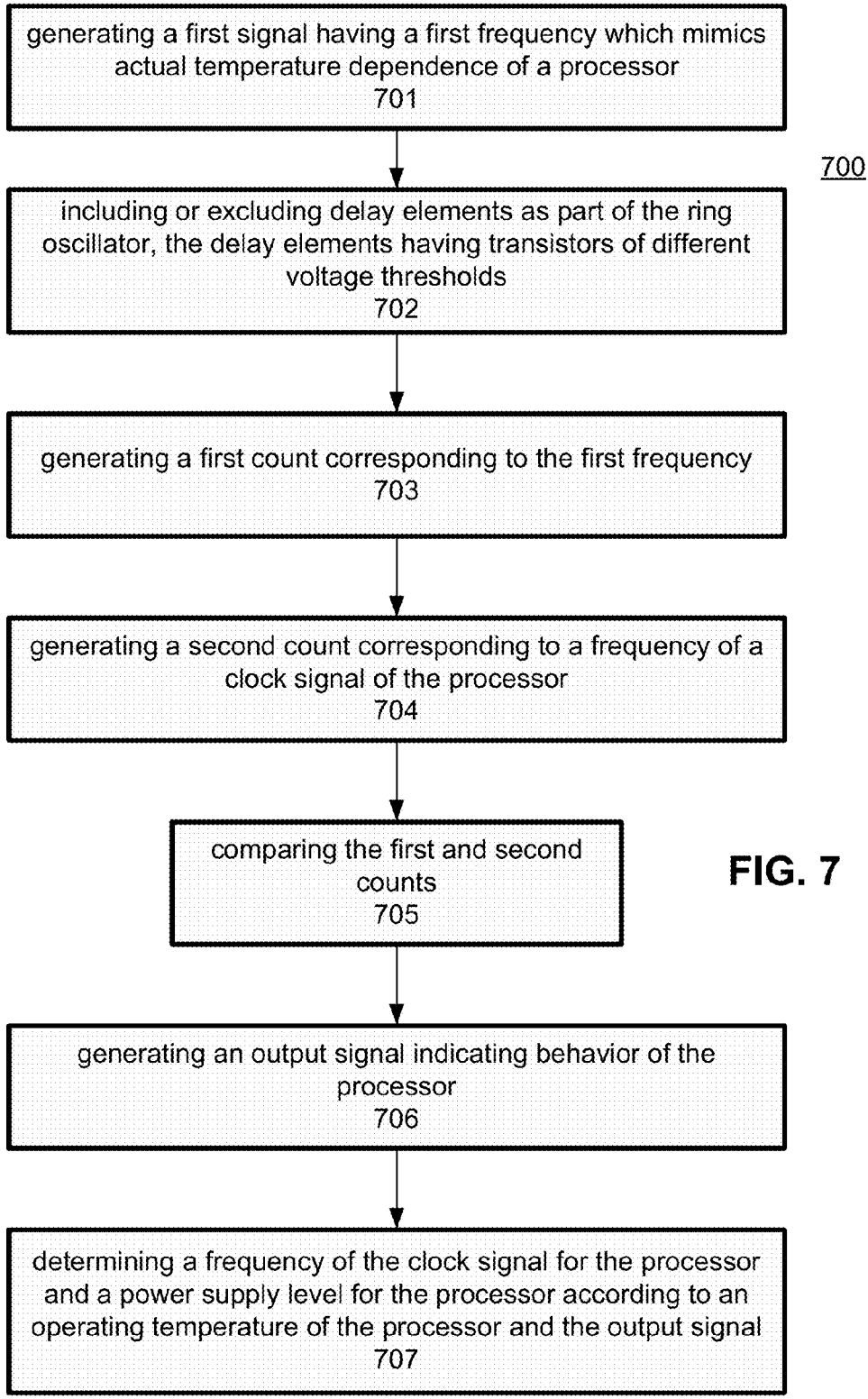
FIG. 7 is a method flowchart for sensing the behavior of the processor via the replica ring oscillator for adaptively compensating RTD effects, according to one embodiment of the invention.

FIG. 7 is a method flowchart 700 for sensing the behavior of the processor via the replica ring oscillator 600 for adaptively compensating RTD effects, according to one embodiment of the invention. Although the blocks in the flowchart 700 are shown in a particular order, the order of the actions can be modified. Thus, the illustrated embodiments can be performed in a different order, and some actions/blocks may be performed in parallel. Additionally, one or more actions/blocks can be omitted in various embodiments of sensing the behavior of the processor for adaptively compensating RTD effects. The flowchart of FIG. 7 is illustrated with reference to the embodiments of FIGS. 2-6.

At block 701, the first signal 607 having a first frequency which mimics actual temperature dependence of the processor core 201 is generated by the ring oscillator 601. At block 702, delay elements (601a-c) are included or excluded from sub-rings of the ring oscillator 601. As discussed herein, the delay element comprises one or more of: inverters having n-type transistors of different thresholds voltages and p-type transistors of different thresholds, two input NAND gates, three input NAND gates, two input NOR gates, or three input NOR gates.

At block 703, a first count 610 is generated by the first counter 603, wherein the first count 610 corresponds to the first frequency (of the signal 607). At block 704, a second count 609 is generated by the second counter 602, wherein the second count 609 corresponds to a frequency of a clock signal 608 of the processor core 201. At block 705, the first 610 and second 609 counts are compared by the comparator 606. At block 706, the comparator 606 generates an output signal 207 (also called the third signal) indicating the behavior of the processor core 201. The output signal 207 is transmitted to the PCU 204.

At block 707, the PCU 204 determines a frequency of the clock signal for the processor core and a power supply level for the processor core according to an operating temperature of the processor and the output signal. In one embodiment, the PCU 204 reduces the frequency of the core clock signal 608, according to the output signal 207, when the operating temperature and voltage level indicate that the processor core 201 is in a region of RTD. In one embodiment, the PCU 204 causes the VR 206 to increase the power supply level, according to the output signal 207, when the operating temperature and the power supply voltage level indicate that the processor core 201 is operating in the region of RTD. In one embodiment, the PCU 204 causes the VR 206 to increase its power supply level and causes the PLL 205 to reduce the core clock frequency.

Figure 8:
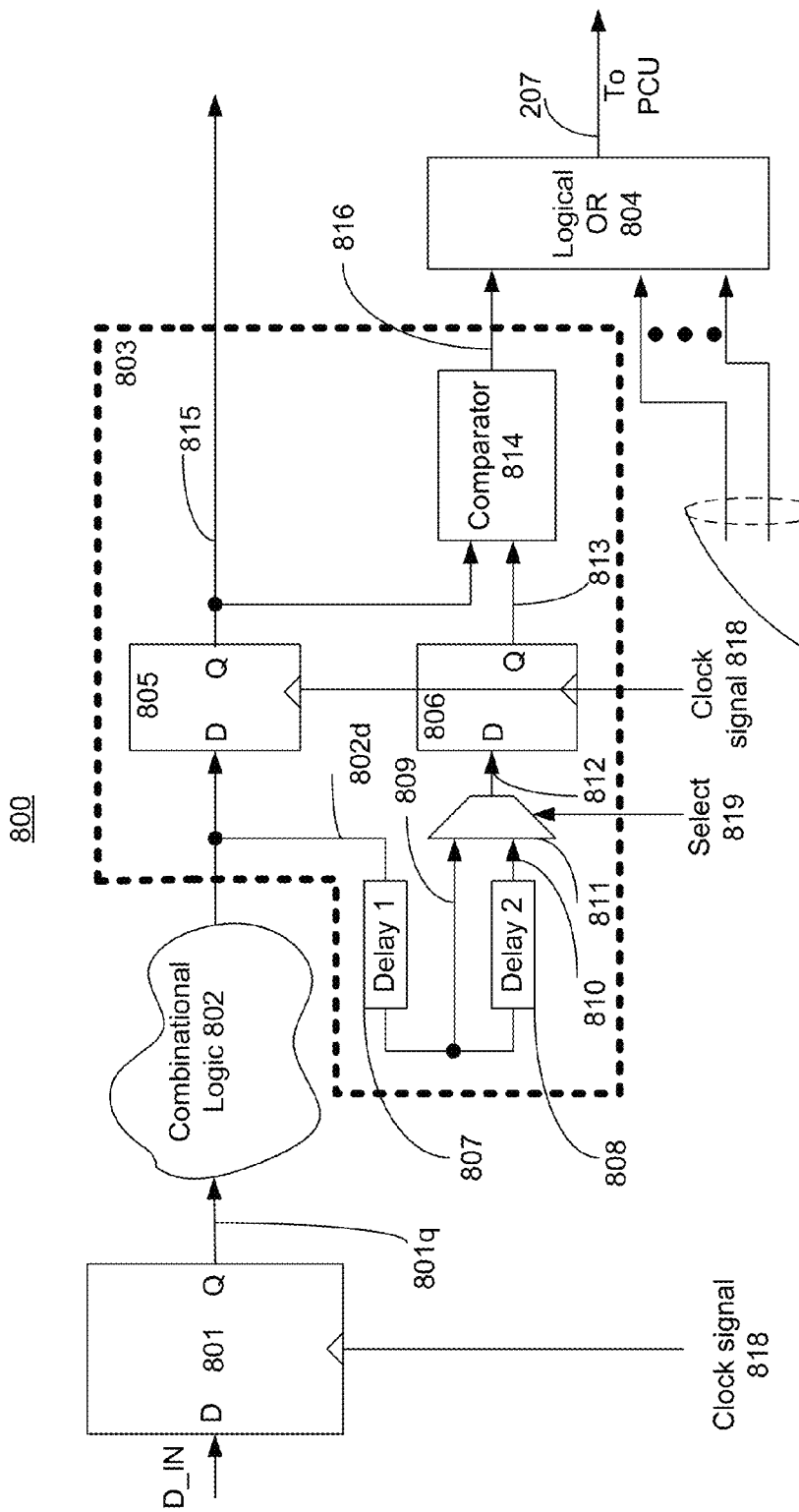
FIG. 8 is an in-situ timing error warning sensor for sensing the behavior of the processor for adaptively compensating RTD effects, according to one embodiment of the invention.

FIG. 8 is a logical path 800 with an in-situ timing error warning sensor 803 for sensing the behavior of the processor for adaptively compensating RTD effects, according to one embodiment of the invention. So as not to obscure the embodiments of the invention, the description herein discusses the use of the in-situ timing error warning sensor 803 for the processor core 201. For multi-core processors, as shown in FIG. 3, each processor core from the processor cores $301_{1-4}$ includes its own in-situ timing error warning sensor 803 (second sensors $303_{1-4}$) to mimic the actual temperature dependence of that processor core. In such an embodiment, the PCU 304 is operable to receive the outputs from each in-situ timing error warning sensor and determine the behavior of each processor core of the processor 300. In one embodiment, the PCU 304 increases the power supply to the processor core that is indicating RTD effects.

In one embodiment, the second sensor 203 is the in-situ timing error warning sensor 803. In one embodiment, the in-situ timing error warning sensor 803 is placed at the end of all timing critical paths and provides an early warning of an imminent timing failure before the failure actually occurs. For example, with reference to the logic path 800, the in-situ timing error warning sensor 803 is placed after combinational logic 802, wherein the critical path begins at the input of a sequential logic unit 801 and ends at the input of the in-situ timing error warning sensor 803.

In one embodiment, in-situ timing error warning sensor 803 comprises a first sequential logic unit 805 to receive a data signal 802d from the combinational logic unit 802, the first sequential logic unit 805 to generate a first output signal 815. In this embodiment, the in-situ timing error warning sensor 803 further comprises; a second sequential logic unit 806 operable to receive a delayed data signal 812 from the combinational logic unit 802, the second sequential logic unit 806 to generate a second output signal 813.

In one embodiment, the in-situ timing error warning sensor 803 comprises a comparator 814 to compare the first 815 and second 813 output signals and to generate a third output signal 816, wherein the third output signal 816 indicates a timing behavior of a data path (D_in→801→801q→802→815) in the processor core 201, and wherein the third output signal 816 is received by the PCU 204 to adjust a power supply or clock signal frequency of the processor core 201 according to the third output signal 813. In one embodiment, the comparator 814 is an Exclusive-OR (XOR) gate which generates a pulse on its output node to indicate that a timing failure is imminent.

In one embodiment, the first 805 and second 806 sequential logic units are flip-flops. In other embodiments, other sequential logic units may be used without changing the essence of the embodiments of the invention. In one embodiment, the first sequential logic unit 805 stores the correct logic value at the end of the critical path. That correct value, i.e. signal 815, is received by downstream logic (not shown) for further processing. In this embodiment, the second sequential logic unit 806 stores the delayed signal 812, which will fail first if this additional delay caused by buffers in 807 or 808 and 811 exceeds the existing timing margin. In one embodiment, when the two sequential logic units 805 and 806, which receive the same clock signal 818, latch opposite logic values, the comparator 814 will generate an output signal 816 that will indicate that a timing failure is imminent.

In one embodiment, the delay applied to the signal 812 is adjustable via the multiplexer 811 which is operable to select input delay signals 809 or 810, where the signal 810 is delayed more than the signal 809. In such an embodiment, the multiplexer 811 is controlled by a select signal 819. In one embodiment, the select signal is generated by the PCU 204. One reason for having the capability of adjusting the delay to the signal 812 is to change the granularity of when to indicate a timing failure warning. A longer delay may provide more time to react for compensating for RTD effects after generating the warning signal 207. In one embodiment, the delay units 807 and 808 comprise one or more buffers.

In one embodiment, the output of the comparator 814 is received by a gate 804 which applies logical OR operation with other signals 817 output from other comparators (not shown) from other critical paths in the processor core 201. In one embodiment, the gate 804 comprises a NOR gate. In one embodiment, the output 207 of the gate 804 is output to the PCU 204. In one embodiment, the PCU 204 is operable to perform at least one of the following according to the signal 207: reduce the frequency of the clock signal when the operating temperature is in a region of RTD; increase the power supply level when the operating temperature is in the region of RTD; or increase the power supply level and reduce frequency of the clock signal when the operating temperature is in the region of RTD.

In one embodiment, a distributed NOR gate 804 merges all the failure signals into a single bit that indicates a timing failure is imminent. The term "distributed" herein refers to two or more NOR gates that receive outputs from various comparators to generate a single bit that indicates that a timing failure is imminent. In one embodiment, the single bit is sent to the PCU 204/304 which will immediately lower the frequency of the processor core or raise the voltage level to the processor core 201. In one embodiment, lowering the frequency may be preferred over increasing the voltage supply level because lowering the frequency can be achieved faster. In other embodiments, the reverse is possible without changing the scope of the embodiments of the invention. In one embodiment, the in-situ method discussed herein enables closer adaptive tracking since the in-situ sensor 803 provides a real-time indication of an impending timing failure.

In one embodiment, with reference to FIG. 3, the third output signal is logically OR-ed with other output signals from other comparators, wherein the other output signals are from other data paths in other hardware processing cores of the processor 300.

Figure 9:
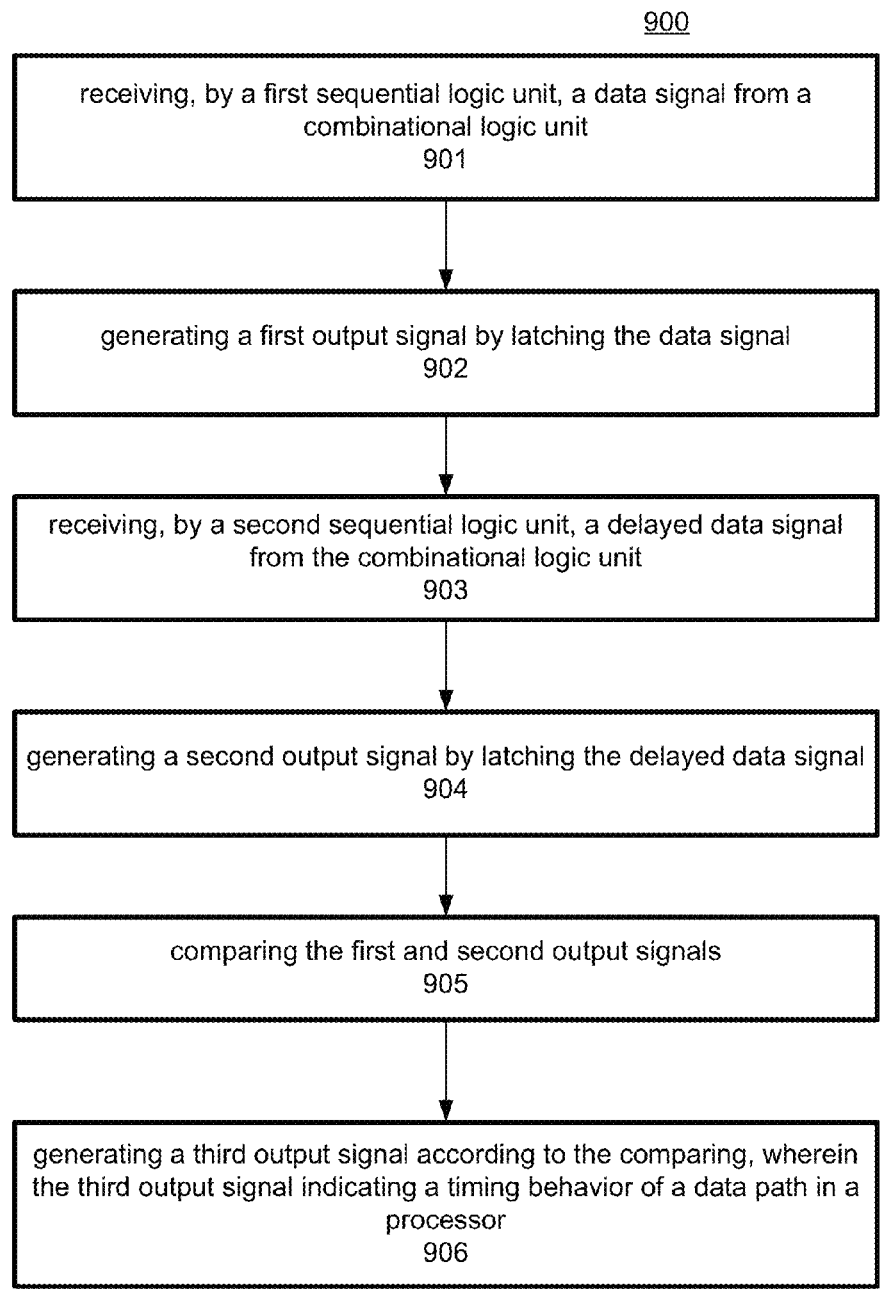
FIG. 9 is a method flowchart for sensing the behavior of the processor via the In-situ timing error warning sensor for adaptively compensating RTD effects, according to one embodiment of the invention.

FIG. 9 is a method flowchart 900 sensing the behavior of the processor 201 via the in-situ timing error warning sensor 803 for adaptively compensating RTD effects, according to one embodiment of the invention.

Although the blocks in the flowchart 900 are shown in a particular order, the order of the actions can be modified. Thus, the illustrated embodiments can be performed in a different order, and some actions/blocks may be performed in parallel. Additionally, one or more actions/blocks can be omitted in various embodiments of sensing the behavior of the processor via the in-situ timing error warning sensor for adaptively compensating RTD effects. The flowchart of FIG. 9 is illustrated with reference to the embodiments of FIGS. 2-8.

At block 901, the first sequential logic unit 805 receives the data signal 802d from the combinational logic unit 802. At block 902, the first sequential logic unit 805 latches the data signal 802d to generate the first output signal 815. This first output signal 815 is then transmitted to other logic units downstream. At block 903, the second sequential logic unit 806 receives a delayed version 812 of the data signal 802d. At block 904, the second sequential logic unit 806 latches the delayed data signal 812 to generate the second output signal 813. At block 905, the comparator 814 compares the first 815 and second 813 output signals to generate an output signal 816. In one embodiment, the output signal 816 is logically OR-ed with other similar signals which are outputs from other comparators of other data paths in the processor core 201 or other processor cores 301$_{1-4}$. At block 906, the output of the logical OR operation generates a third output signal 207 indicating a timing behavior of the data path of 800 in the processor core 201. The output signal 207 is then sent to the PCU 204 for generating control signals for the VR 206 and/or the PLL 205 to compensate for RTD effects.

Figure 10:
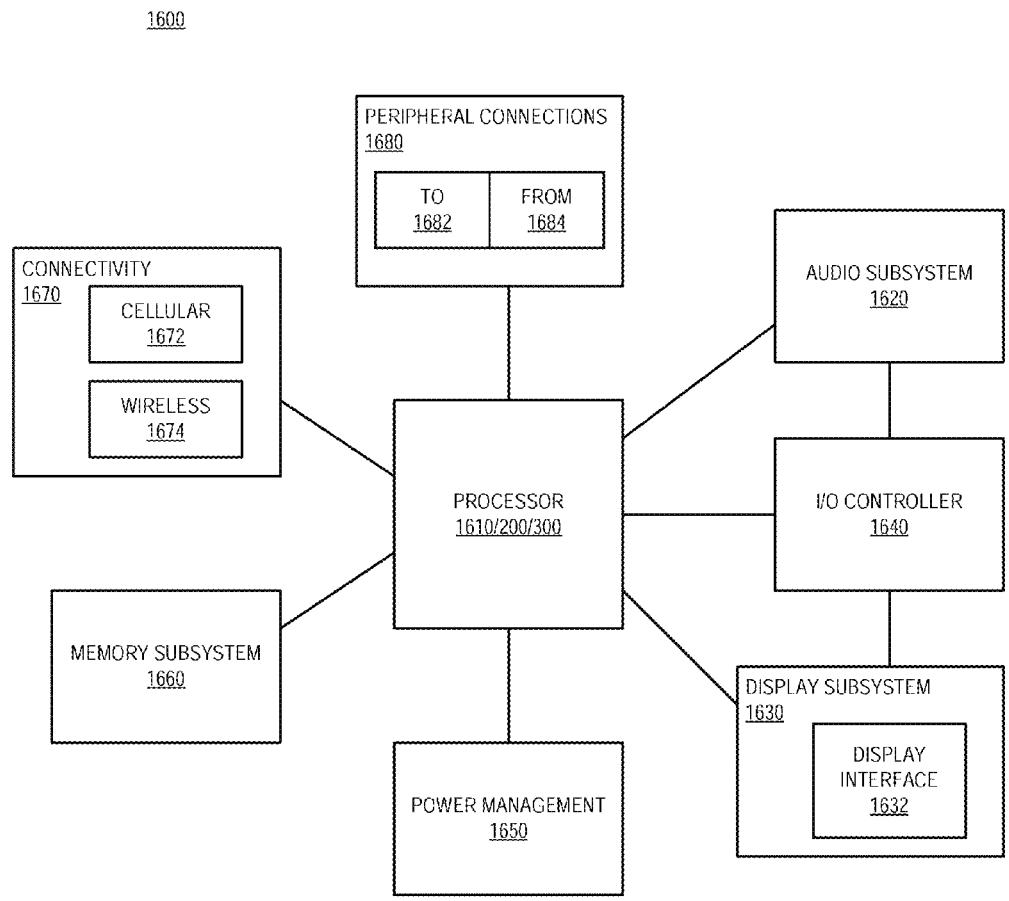
FIG. 10 is a system-level diagram of a smart device comprising a processor which is operable to adaptively compensate RTD effects, according to one embodiment of the invention.

FIG. 10 is a system-level diagram 1600 of a smart device comprising a processor with is operable to adaptively compensate RTD effects, according to one embodiment of the invention. FIG. 10 also illustrates a block diagram of an embodiment of a mobile device in which flat surface interface connectors could be used. Computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600. Device 1600 includes processor 1610 such as the processor 200/300 discussed herein.

The processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting device 1600 to another device. The processing operations may also include operations related to audio I/O and/or display I/O.

In one embodiment, device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to device 1600. In one embodiment, a user interacts with device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 can operate to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of device 1600. Additionally, audio output can be provided instead of or in addition to display output. In another example, if display subsystem includes a touch screen, the display device also acts as an input device, which can be at least partially managed by I/O controller 1640. There can also be additional buttons or switches on device 1600 to provide I/O functions managed by I/O controller 1640.

In one embodiment, the I/O controller 1640 manages devices such as accelerometers, cameras, light sensors or other environmental sensors, or other hardware that can be included in device 1600. The input can be part of direct user interaction, as well as providing environmental input to the system to influence its operations (such as filtering for noise, adjusting displays for brightness detection, applying a flash for a camera, or other features).

In one embodiment, device 1600 includes power management 1650 that manages battery power usage, charging of the battery, and features related to power saving operation. Memory subsystem 1660 includes memory devices for storing information in device 1600. Memory can include non-volatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of system 1600.

Elements of embodiments are also provided as a machine-readable medium (e.g., memory 1660) for storing the computer-executable instructions (e.g., instructions to implement the flowcharts of FIG. 5, FIG. 7, FIG. 9 and any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable device 1600 to communicate with external devices. The device could be separate devices, such as other computing devices, wireless access points or base stations, as well as peripherals such as headsets, printers, or other devices.

Connectivity 1670 can include multiple different types of connectivity. To generalize, device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that device 1600 could both be a peripheral device ("to" 1682) to other computing devices, as well as have peripheral devices ("from" 1684) connected to it. Device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow device 1600 to control content output, for example, to audiovisual or other systems.

In addition to a proprietary docking connector or other proprietary connection hardware, device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, the adaptive RTD compensation discussed herein is not limited to processor cores, but can be used for any other circuits experiencing RTD effects. In one embodiment, the RTD compensation techniques discussed herein can be applied to graphics accelerators. In other embodiments, the RTD compensation techniques discussed herein can be applied to media blocks. In one embodiment, the RTD compensation techniques discussed herein can be applied to cache or memory controllers.

The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a first sensor to determine operating temperature of a processor;
   a second sensor to determine behavior of the processor, wherein the second sensor is one of a replica core behavior sensor or an in-situ timing warning sensor, and wherein the replica core behavior sensor comprises a ring oscillator to generate a first signal having a first frequency, the ring oscillator operable to mimic actual temperature dependence of the processor; and
   a control unit to determine a frequency of a clock signal for the processor and a power supply level for the processor according to the determined operating temperature and behavior of the processor.

2. The apparatus of claim 1, wherein the control unit to perform at least one of:
   adaptively increase the power supply level from an existing power supply level; or adaptively reduce the frequency of the clock signal from an existing frequency of the clock signal when the operating temperature is in a region of reverse temperature dependence (RTD).

3. The apparatus of claim 1, wherein the processor comprises a plurality of hardware processing cores, and wherein the control unit to determine a frequency of a clock signal and a power supply level for each of the hardware processing cores of the plurality of hardware processing cores.

4. The apparatus of claim 1, wherein the first sensor is one of a local or remote temperature sensor.

5. The apparatus of claim 1, wherein the replica core behavior sensor comprises:
 a first counter to generate a first count corresponding to the first frequency;
 a second counter to generate a second count corresponding to the frequency of the clock signal of the processor; and
 a comparator, coupled to the first and second counters, to compare the first and second counts and to generate an output signal indicating the behavior of the processor.

6. The apparatus of claim 5, wherein the ring oscillator comprises one or more of:
 inverters having n-type transistors of different thresholds voltages and p-type transistors of different thresholds,
 two input NAND gates,
 three input NAND gates,
 two input NOR gates, or
 three input NOR gates.

7. The apparatus of claim 1, wherein the behavior of the processor comprises at least one of:
 work load of the processor; and
 timing margin for a critical data path in the processor.

8. The apparatus of claim 1, wherein the control unit includes a storage medium having instructions stored thereon to operate the control unit, and wherein the instructions are invisible to an operating system.

9. The apparatus of claim 1 further comprises:
 a phase locked loop (PLL) to generate the clock signal for the processor.

10. The apparatus of claim 9, wherein the control unit to adjust a multiplier of the PLL to adjust the frequency of the clock signal.

11. The apparatus of claim 10, wherein the PLL is at least one of:
 a self-biased PLL (SBPLL); or
 an all digital PLL (ADPLL).

12. The apparatus of claim 1 further comprises:
 a voltage regulator (VR) to generate the power supply level for the processor.

13. The apparatus of claim 12, wherein the VR is an on-die VR positioned in the die having the processor.

14. The apparatus of claim 1, wherein the control unit is operable to:
 monitor the first and second sensors;
 learn an operating frequency limit of the processor at various power supply levels according to the monitored first and second sensors, the monitoring to generate monitored data; and
 store the monitored data in a memory.

15. An apparatus comprising:
 a first sensor to determine operating temperature of a processor;
 a second sensor to determine behavior of the processor, wherein the second sensor is one of a replica core behavior sensor or an in-situ timing warning sensor, wherein the in-situ timing warning sensor comprises:
  a first sequential logic unit to receive a data signal from a combinational logic unit, the first sequential logic unit to generate a first output signal;
  a second sequential logic unit operable to receive a delayed data signal from the combinational logic unit, the second sequential logic unit to generate a second output signal; and
  a comparator to compare the first and second output signals and to generate a third output signal, wherein the third output signal indicating a timing behavior of a data path in a processor; and
 a control unit to determine a frequency of a clock signal for the processor and a power supply level for the processor according to the determined operating temperature and behavior of the processor.

16. The apparatus of claim 15, wherein the third output signal is received by the control unit to adjust the power supply level or the clock signal frequency of the processor according to the third output signal.

17. The apparatus of claim 15, wherein the control unit comprises a table having predetermined differences between the first and second output signals, and wherein the control unit to compare the third output signal with the predetermined differences.

18. A sensor comprising:
 a ring oscillator to generate a first signal having a first frequency, the ring oscillator operable to mimic actual temperature dependence of a processor;
 a first counter to generate a first count corresponding to the first frequency;
 a second counter to generate a second count corresponding to a frequency of a clock signal of the processor; and
 a comparator, coupled to the first and second counters, to compare the first and second counts and to generate an output signal indicating a behavior of the processor.

19. The sensor of claim 18, wherein the ring oscillator is operable to:
 include or exclude delay elements as part of the ring oscillator, the delay elements having transistors of different voltage thresholds; or
 include or exclude delay elements to mimic the actual temperature dependence of a core of the processor.

20. The sensor of claim 18, wherein the output signal is received by a power control unit, and wherein the power control unit to perform at least one of:
 reduce the frequency of the clock signal when the operating temperature is in a region of reverse temperature dependence (RTD);
 increase the power supply level when the operating temperature is in the region of RTD; or
 increase the power supply level and reduce frequency of the clock signal when the operating temperature is in the region of RTD.

* * * * *